United States Patent [19]

Custode et al.

[11] 4,231,051
[45] Oct. 28, 1980

[54] PROCESS FOR PRODUCING MINIMAL GEOMETRY DEVICES FOR VSLI APPLICATIONS UTILIZING SELF-ALIGNED GATES AND SELF-ALIGNED CONTACTS, AND RESULTANT STRUCTURES

[75] Inventors: Frank Z. Custode, Norco; Matthias L. Tam, Monterey Park, both of Calif.

[73] Assignee: Rockwell International Corporation, El Segundo, Calif.

[21] Appl. No.: 913,258

[22] Filed: Jun. 6, 1978

[51] Int. Cl.$^2$ .............................................. H01L 29/78
[52] U.S. Cl. ........................................ 357/23; 29/571; 29/577 C; 29/589; 357/41; 357/59
[58] Field of Search ................. 29/571, 577, 578, 589, 29/590, 591; 357/23, 41, 59

[56] References Cited

U.S. PATENT DOCUMENTS

| | | | |
|---|---|---|---|
| 4,080,719 | 3/1978 | Wilting | 357/59 |
| 4,102,733 | 7/1978 | De La Moneda | 357/59 |

Primary Examiner—W. C. Tupman
Attorney, Agent, or Firm—H. Fredrick Hamann; Harry John Staas

[57] ABSTRACT

A process for producing VLSI (very large scale integrated) circuits employs techniques of self-aligned gates and contacts for FET devices and for diffused conducting lines in the substrate. Mask alignment tolerances are increased and rendered non-critical. The use of materials in successive layers having oxidation and etch characteristics permits selective oxidation of desired portions only of the structure without need for masking, and removal of selected material from desired locations by batch removal processes again without use of masking. There results semiconductor devices of minimum geometry with selective interconnection capabilities, affording VLSI circuits having increased density with improved yield and reliability.

10 Claims, 27 Drawing Figures

PROCESS FOR PRODUCING MINIMAL GEOMETRY DEVICES FOR VSLI APPLICATIONS UTILIZING SELF-ALIGNED GATES AND SELF-ALIGNED CONTACTS, AND RESULTANT STRUCTURES

BACKGROUND OF THE INVENTION

1. Field of the Invention

The invention relates to the field of semiconductor device fabrication techniques and devices and, more particularly, to the field of fabrication techniques for achieving very large scale integrated (VSLI) circuits and to the resulting device configurations of VSLI circuits.

2. Prior Art

The semiconductor art has been concerned with reducing the size and power consumption of individual devices in integrated circuits in order to increase the logic power of these circuits per unit area. Many things have been done over the years to reduce the size of devices and improve the tolerances with which they are fabricated. Such efforts have included, inter alia, fine line lithography, improved mask generation and alignment machines, improved tolerances on mask alignment, and self-aligned gates. These techniques have reduced the area required for fabrication of an individual device. However, because of alignment tolerances, devices must be designed with larger geometries than they would have to be if perfect mask alignment were attained.

Consequently, there is a need for improved mask alignment techniques for fabrication techniques having reduced sensitivity to mask alignment.

SUMMARY OF THE INVENTION

The present invention allows fabrication of integrated circuits comprising individual devices whose dimensions are smaller than those required by the prior art. This is made possible through the use of self-aligned contacts which minimize the effect of mask misalignments on device yield and, in addition, reduce the extra area which must be dedicated to a device in order to allow for mask misalignment. Self-aligned contacts are obtained by utilizing an oxidation-resistant layer such as silicon nitride to prevent the oxidation of areas where contacts are to be formed while isolating oxide (e.g., the field oxide) is grown elsewhere. The use of such an oxidation—resistant layer allows reduced geometry devices to be fabricated with a high yield despite mask misalignment, and further allows the fabrication of such reduced geometry devices within the range of present production masking alignment tolerances.

BRIEF DESCRIPTION OF THE DRAWINGS

FIG. 1 is a cross-sectional view through a semiconductor wafer having a thermal oxide layer on its surface.

FIG. 2 is a plan view illustrating a portion of a polycrystalline silicon to monocrystalline silicon contact mask.

FIG. 3 is a cross-sectional view taken along line 3—3 in FIG. 2, illustrating the wafer cross-sectional structure following the removal of the unprotected oxide in accordance with the masking pattern of the mask of FIG. 2.

FIG. 4 is a cross-sectional view as in FIG. 3, illustrating the wafer cross-sectional structural, after the deposition of a polysilicon layer and the successive deposition of a silicon nitride layer.

FIG. 5 is a plan view illustrating an isolation mask utilized for defining areas where an isolating field oxide will be formed.

FIG. 6 is a cross-sectional view through the wafer taken along line 6—6 in FIG. 5, after removal of various layers from the areas which are not protected by the photoresist exposed through the isolation mask of FIG. 5.

FIG. 7 is a cross-sectional view as in FIG. 6, illustrating the wafer following the growth of the field oxide.

FIG. 8 is a plan view illustrating a gate contact mask.

FIG. 9 is a cross-sectional view taken along line 9—9 in FIG. 8, showing the wafer cross-sectional structure following the definition of the photoresist layer in accordance with the gate contact mask of FIG. 8.

FIG. 10 is a cross-sectional view as in FIG. 9, illustrating the wafer following the removal of selected materials which are not protected by the portions of the photoresist layer of FIG. 9 defined by the mask of FIG. 8, producing troughs extending to and exposing the surface of the silicon wafer and delineating the gate, source and drain polysilicon-to-silicon contact regions.

FIG. 11 is a cross-sectional view as in FIG. 10, illustrating the wafer cross-sectional structure following the growth of a cross-over oxide in the troughs of FIG. 10.

FIG. 12 is a plan view illustrating a metalization mask for defining the metalization pattern of the wafer.

FIG. 13 is a cross-sectional view along line 13—13 in FIG. 2, illustrating the wafer following delineation of the metalization in accordance with the masking produced by the mask of FIG. 12.

DETAILED DESCRIPTION OF PREFERRED EMBODIMENT

The technique which is the broad subject of this invention is widely applicable in the field of semiconductor fabrication. Many variations of the technique are possible in accordance with the individual objectives of various fabrication processes. However, the basic concept of the process is best illustrated by a specific example of the fabrication of a specific device. Consequently, the following detailed description will describe the fabrication of an N channel field effect transistor in an integrated circuit. However, it will be readily understood that this process is equally applicable to the formation of P channel transistors and to many other devices.

Figure 1:
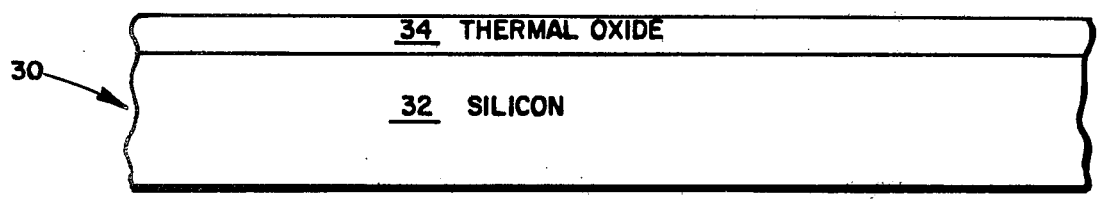
FIGS. 1, 3, 4, 6, 7, 9-11 and 13 are cross-sectional drawings illustrating successive stages in the processing of a semiconductor wafer in accordance with the invention.

We now turn to the detailed description of the preferred embodiment of the invention and in particular to FIG. 1 which illustrates a wafer 30 of clean semiconductor material (e.g.—silicon) 32 on which a dielectric layer 34 has been formed. The semiconductor 32 may either constitute the entire body of the wafer prior to the formation of the dielectric layer 34 or may comprise a relatively thin layer disposed on an appropriate supporting substrate. The treatment utilized to form the dielectric layer 34 may in part depend on the semiconductor 32. However, in accordance with the specific process steps of this preferred embodiment, the dielectric layer 34 should be one which is suitable for use as a gate dielectric of a field effect transistor (FET).

Semiconductor 32 is preferably silicon and the treatment preferably comprises thermally oxidizing the surface to form a silicon dioxide layer as the dielectric layer 34, suitable for use as the gate dielectric of field effect transistors. For the purposes of this description, it will be assumed that semiconductor 32 is already doped p-type. The dielectric layer 34 is then patterned in accordance with a predetermined pattern. This may be done by any appropriate process, but is preferably done using photoresist and photolithography.

Figure 2:
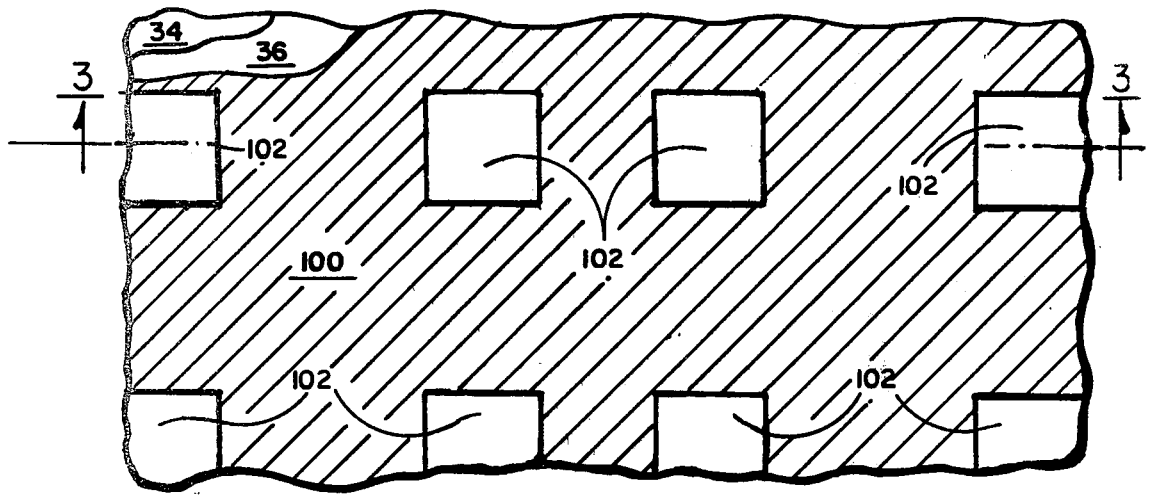
FIGS. 2, 5, 8 and 12 are plan views illustrating different masks utilized during the process of forming devices in accordance with the invention and the relative alignment of different masks with respect to the underlying wafer.
Figure 3:
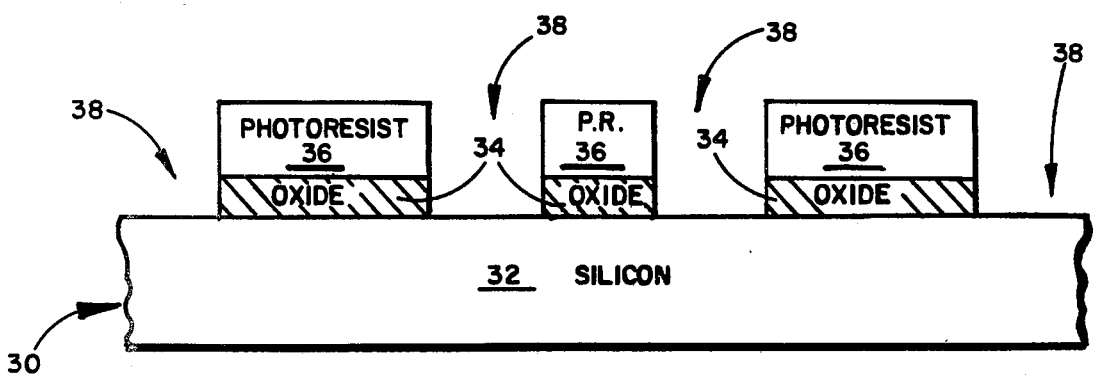

A layer 36 of appropriate photoresist is provided on the wafer 30 on top of layer 34 and exposed to actinic radiation through a contact mask 100 (plan view FIG. 2) which includes non-protective areas 102 which render the photoresist thereunder soluble while the remainder of the photoresist is rendered nonsoluble. After exposure of the photoresist to actinic radiation through mask 100, the photoresist is developed with the result that photoresist 36 remains on the wafer everywhere except within those areas 38 of the wafer which were in alignment with mask areas 102. Layer 34 is not protected by the photoresist is those areas 38. The unprotected portions of layer 34 are removed in an appropriate manner. Where layer 34 is silicon dioxide, wafer 30 may be etched in a silicon dioxide etchant such as hydrofluoric acid until all of the oxide 34 in the regions 38 has been removed to leave bare unprotected silicon in the unprotected regions 38 while portions of the gate dielectric layer 34 are retained under photoresist 36. At the end of this removal step, the wafer appears in cross-section as shown in FIG. 3. Thereafter, the remaining photoresist 36 is removed.

As will later become clear, the portions, or areas, 38 of the surface of the silicon semiconductor layer 32 which are exposed in this step are those which will include the source and the drain, for example, of the field effect transistor to be formed. Although not specifically shown, an N-channel conductive line could be defined by the mask 100 and, by these same steps, would result in a similar cross-section having an open area 38 as for the source and drain of the field effect transistor being formed in this specific example. Doping of the silicon 32 may now be performed through these exposed areas 38. The remaining portions of the oxide layer 34, such as seen in cross-section to the left and right of the central, gate dielectric portion of the oxide layer 34 in the view of FIG. 3, are retained for the purpose of preventing undesired doping of the silicon layer 32 in those regions; in this example, those regions will be employed for thermally growing a field oxide to isolate the field effect transistor from adjacent devices.

Figure 4:
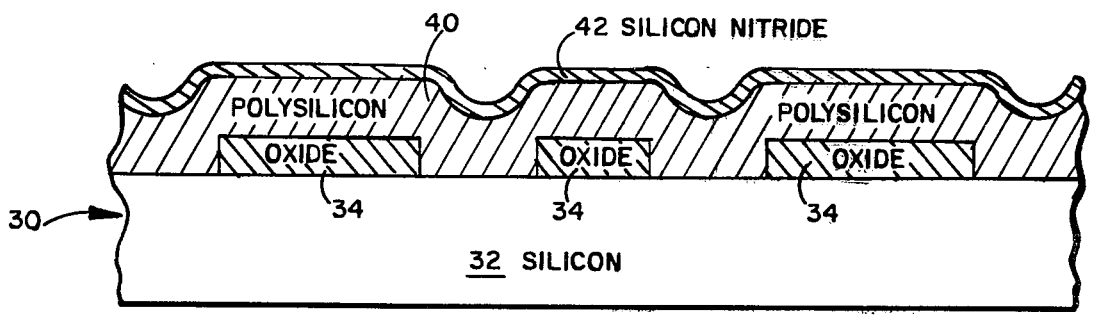

As shown in FIG. 4, a layer 40 of doped polycrystalline silicon (polysilicon) is deposited over the entire surface of the wafer and the polysilicon layer 40 is then coated with a layer 42 of silicon nitride. Layer 40 may be undoped and then doped in situ by exposure to high temperature diffusion or ion implantation. The polysilicon 40 is doped to have the same conductivity type as the source and drain will have (n-type in this example). The polysilicon 40 is then patterned, preferably by use of photoresist. As will later be seen, the use of the silicon nitride layer 42 is of substantial significance, since it permits selective oxidation of the exposed surfaces of the silicon 32. For example, field oxide regions may be thermally grown on the exposed silicon surface without using a mask, since the surfaces protected by a silicon nitride layer 42 are not readily oxidized. Particularly, silicon nitride requires a much higher temperature for thermal oxidation than does silicon. In another context, the silicon nitride layer can be etched preferentially or selectively as respects correspondingly exposed surfaces of silicon dioxide without masking, e.g., by using a dip etch. This factor contributes as well to the capability of achieving self-aligned gate and other contacts.

In accordance with the present example, the next step is to produce a desired pattern in the silicon nitride protecting layer 42. A layer 44 of photoresist is provided on the silicon nitride layer 42 and exposed to actinic radiation through an isolation mask 110 (seen in FIG. 5). The isolation mask 110 includes substantially rectangular protective regions 114 which cause the photoresist thereunder to be rendered non-soluble while the remainder of the photoresist is rendered soluble as a result of the exposure of the photoresist to actinic radiation. The configuration of the isolation mask and its desired alignment with the polycrystalline-silicon to monocrystalline-silicon contact regions 38 are illustrated in the plan view of FIG. 5.

Figure 5:
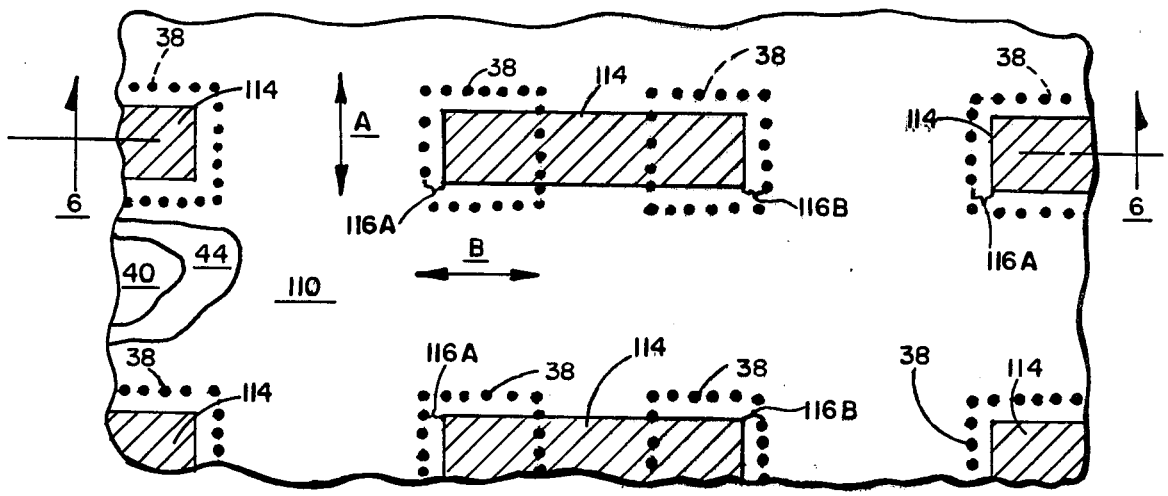

As is apparent from FIG. 5, the contact regions 38 as initially defined are of larger size than the final dimensions of the actual areas of contact to the substrate, as determined by subsequent processing steps; particularly, the protection regions 114 are of reduced length relatively to the distance between the outer boundaries of the contact regions 38 and of relatively reduced width. Subsequent processing, to be described, removes the polysilicon 40 and, optionally, may remove as well any of the oxide 34, which remains outside the perimeter of respective ones of the various protecting regions 114. Thus the area of contact between the polysilicon 40 and the silicon substrate 32, as afforded by protection regions 114 of mask 110, is reduced relatively to the substrate area 38 exposed through mask 100. Subsequent figures, however, retain these initial dimensions of the contact regions 38, and of the gate oxide 34, for purposes of illustrating the tolerance to mask misalignment afforded by the present invention.

Figure 6:
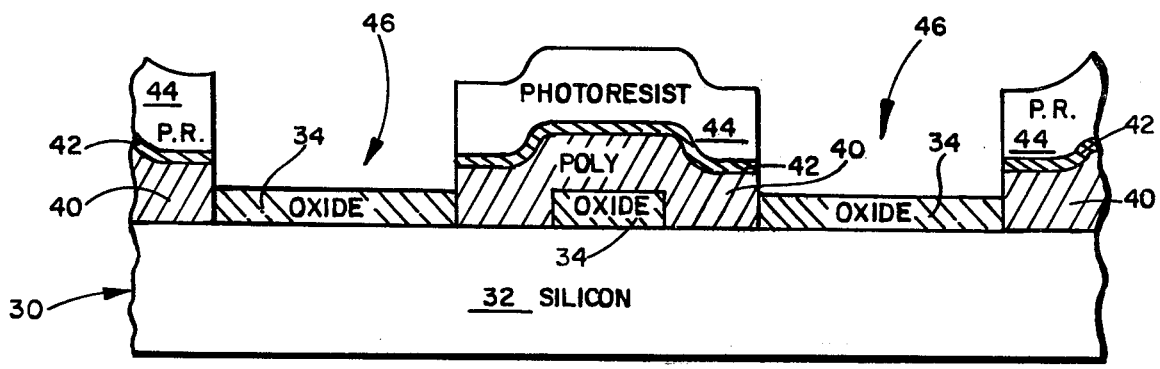

The alignment of the isolation mask in the "A" direction is adequate if the protecting regions 114 do not extend beyond the upper or lower edges of the poly-to-mono-silicon contact regions 38 in FIG. 5. The alignment of the isolation mask in the "B" direction also has a substantial tolerance as the result of the succeeding processing steps. The left-hand and right-hand vertical edges of areas 114 in FIG. 5 must lie within regions 38. Ideal alignment in the "B" direction will make the distances 116A and 116B between the respective end edges of regions 114 and the outer edging of the respectively associated regions 38 equal. The exposed photoresist layer 44 is developed to uncover the silicon nitride layer 42 in the areas 46 as shown in FIG. 6, where the photoresist was rendered soluble, (i.e. areas not under regions 114); conversely, the photoresist portions 44 which were rendered nonsoluble by the photolithographic exposure of the mask, (i.e. areas under regions 114), remain on the wafer.

Following the development of the photoresist 44 in accordance with the isolation mask 110, the unprotected portions of the silicon nitride layer 42 are removed in an appropriate manner. Next, the polysilicon 42 which was uncovered and thus exposed by the removal of the unprotected portions of the silicon nitride layer 42 is removed in an appropriate manner. Next, the portions of the oxide layer 34 which are uncovered and thus exposed by the removal of portions of the polysilicon layer 40 may be retained, or removed in an appropriate manner, (e.g.—etched away) as desired. As shown in FIG. 6, the silicon dioxide 34 is retained in the areas 46, and the field oxide will be grown further therewith. Removal of the exposed silicon dioxide 34 is desirable when there has been damage to it or its surface rendered irregular during the removal of the overlying polysilicon layer. In those cases, where the silicon dioxide layer 34 is removed, the surface of the silicon 32 is directly exposed and a field oxide is then grown directly on that exposed silicon surface. If the process is being performed on a bulk silicon wafer, the silicon of the wafer may be removed to a depth of approximately 0.5 microns in the unprotected areas. If the process is being performed on a silicon on sapphire or similar composite wafer, the silicon may be removed to a depth such that subsequent field oxidation of the remaining silicon will convert that remaining silicon to a silicon dioxide layer which is substantially level with the upper surface of the remaining portions of the polysilicon layer 40, thereby consuming substantially all of the remaining silicon in regions 46.

In the case of a monocrystalline silicon 32 as the substrate, the unprotected surface has a field oxide grown thereon to prevent inversion of that silicon surface. As before noted, the pattern of polycrystalline-silicon-to-monocrystalline-silicon contact mask 100 was selected to prevent the polysilicon 40 from contacting the monocrystalline silicon 32 in the regions which will form the field oxide, in order to prevent unintentional or or undesired doping of the monocrystalline silicon under the field oxide. At the completion of the above removal steps, subject to the above observations, the wafer appears in cross section as illustrated in FIG. 6.

If it is desired to dope the field regions to control their inversion thresholds, this may be done by ion implantation prior to the removal of photoresist 44 in order that photoresist 44 may act as a self-aligned implantation mask. Thus, if a field implant is performed, the remaining photoresist 44 is removed after the implant is performed; otherwise, photoresist 44 is removed after the completion of the above-discussed removal steps.

Figure 7:
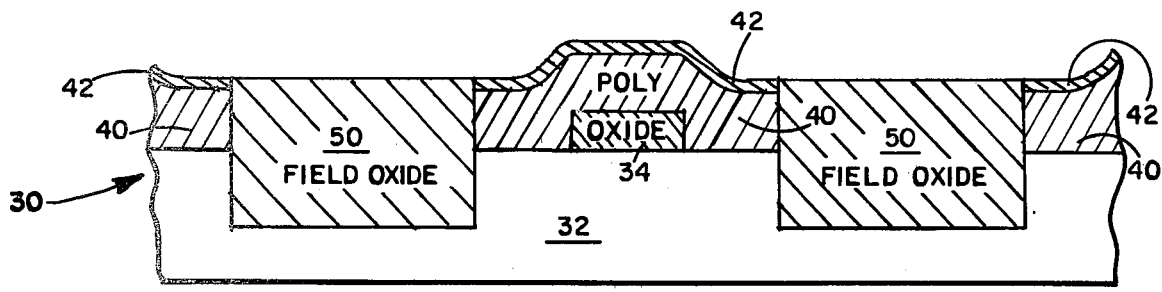

Next, the wafer is exposed to thermal oxidation conditions for a period of time sufficient to oxidize the exposed silicon 32 to form a thermal field oxide layer 50 having an upper surface at a level which minimizes discontinuities between its upper surface and the upper surface of the remaining polysilicon 40. During this thermal oxidation step, oxidation of the retained polysilicon 40 is prevented by the overlying silicon nitride layer 42. After the thermal oxidation process has been terminated, the wafer appears in cross section as in FIG. 7.

Figure 8:
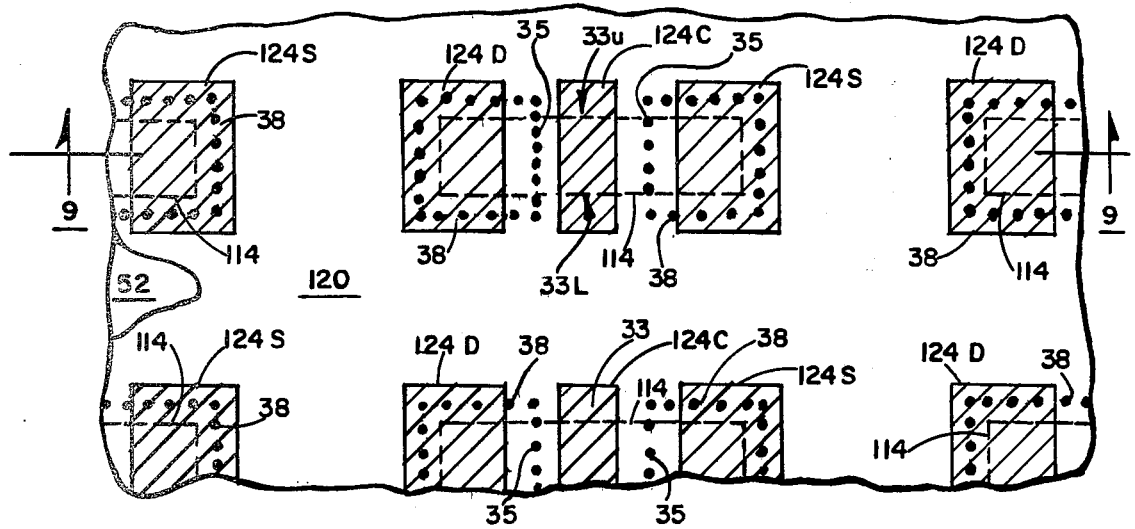

The wafer is then coated with a third photoresist layer 52 which is subsequently exposed to actinic radiation through a gate contact mask 120 (FIG. 8). Processing in accordance with the gate contact mask 120 renders the photoresist thereunder soluble over most of the area but renders the photoresist nonsoluble under mask protective areas 124. Areas 124C each cover a central strip 52C of the photoresist over the multilayered structure comprising the gate oxide 34 and the polysilicon 40 thereon. Areas 124D and 124S are spaced a predetermined distance from the gate mask area 124C and are of a size and configuration such that each covers a significant portion of the photoresist (52D and 52S, respectively) overlying respective ones of the individual polycrystalline-silicon-to-monocrystalline silicon contact areas 38 and extending outwardly therebeyond. This affords a misalignment buffer as regards mask 120 and specifically the areas 124D, C and S thereof relative to the boundaries 114. For proper ultimate device operation, the mask 120 must be aligned in direction "B" so that the (vertical in FIG. 8) edges 35 of the silicon dioxide layer 34, a portion of which will form the gate dielectric after subsequent processing, are both located where they are not protected by the photoresist 52 after it is developed. The mask 120 must be aligned in direction "A" so that the photoresist 52C spans the gate oxide 34 in the direction "A" so that there is a strip of gate oxide (i.e., dielectric) thereunder which is protected, from upper edge 33U in FIG. 8 to lower edge 33L in FIG. 8.

The mask protection areas 124G, relating to the gate, and 124D and 124S, relating respectively to the drain and source, are seen to be again over-size, i.e., larger in both width and length dimensions than those portions of the corresponding regions defined by the mask size 114. As will later be seen, the photoresist elements, or portions 52D, C and S, respectively resulting from the mask protection areas 124D, C and S ultimately will serve to define those portions of the silicon nitride layer 42 which are retained. Retained portions of the silicon nitride layer 42 ultimately will afford self-aligned contact areas to the gate, drain and source regions of the field effect transistor. As above noted, the precise alignment position in the directions A and B of the mask 120 is not critical but rather misalignment of mask 120 may occur, offsetting the actual positions of the particular areas 124C, D, and S, from those ideal positions indicated in FIG. 8. The limits on such offset as may occur and be tolerated, are readily within the capabilities of mask alignment procedures in current technology.

Figure 9:
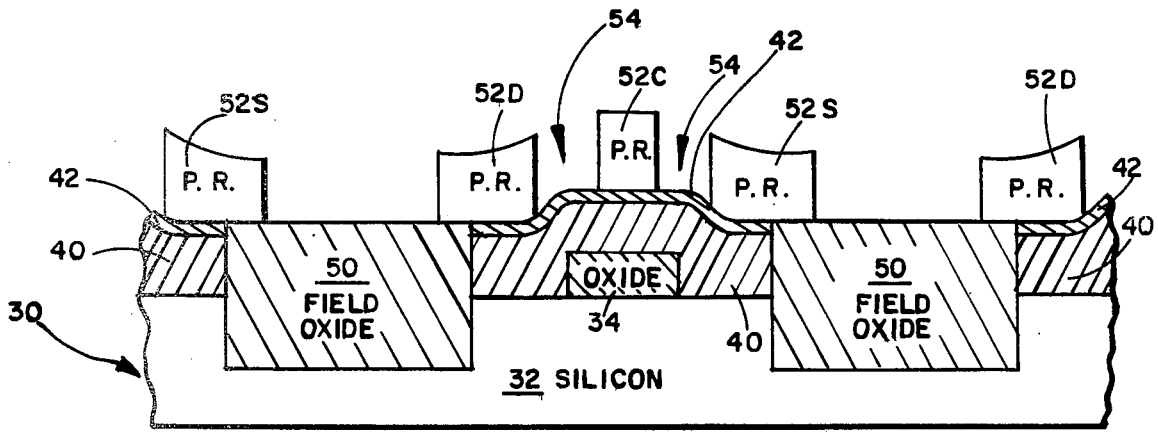
Figure 10:
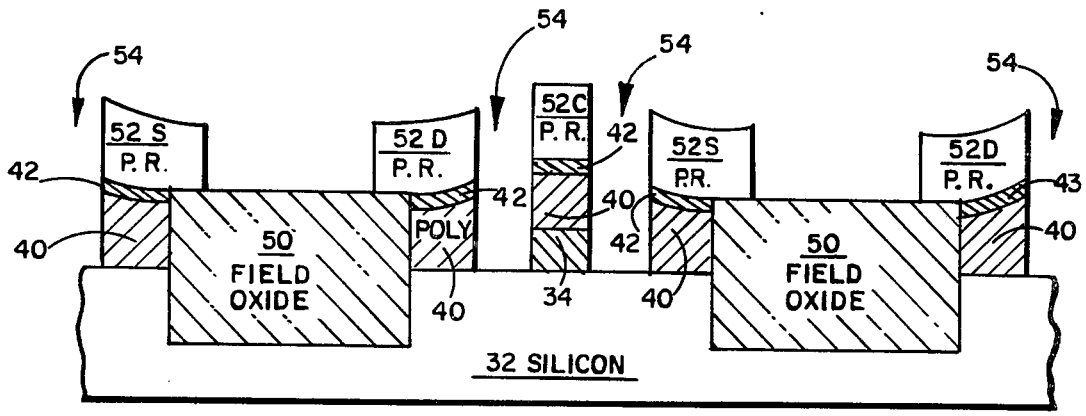

After exposure of the photoresist through the gate contact mask 120, photoresist 52 is developed to remove the soluable portions of the photoresist. FIG. 9 is a cross section through FIG. 8 taken along the line 9—9 after development of the photoresist. After development of the photoresist, there are troughs 54 between each photoresist island 52C and the adjacent photoresist islands 52D and 52S. The islands 52C, 52D and 52S are over channel regions, drain regions nd source regions, respectively, of field effect transistors. Additional islands would be provided for additional types of devices. The unprotected portions of the silicon nitride 42 are removed in an appropriate manner. The polysilicon 40 which is uncovered by the removal of the silicon nitride is removed, preferably with a minimum of attack on the monocrystalline silicon thereunder. The removal of the polysilicon 40 uncovers any portions of the gate oxide 34 which extend laterally beyond the edges of the overlying photoresist 52C. The unprotected portions of the gate oxide 34 are removed in an appropriate manner and the wafer appears as in FIG. 10. The removal of those portions of the gate oxide layer 34 which extend outside the boundaries of the photoresist protection portion 52C will cause removal of material from the field oxides 50 as well. However, the gate oxide 34 is so much thinner than the field oxide that such removal of material from the surface of the field oxide 50 is minimal and not detrimental. Nevertheless, the photoresist drain and source portions 52D and 52S, respectively are located preferably so as to overlap onto the adjacent field oxides 50 as shown in FIG. 10, thereby reducing the possibility of undercutting of the field oxide 50 adjacent the drain and source polysilicon material 40.

After the step of removing the unprotected portions of gate oxide 34 has been completed, the entire bottom of each of the troughs 54 is bare unprotected silicon 32, except at the ends of the troughs where they are over field oxide. The unprotected portions of the silicon 32, which are adjacent the gate or channel regions, are then doped n-type to form source and drain regions. This doping may be done by ion implantation, by solid-state diffusion from doped oxides or by any other appropriate method. The remaining photoresist 52 is removed from the wafer. This step of removing the remaining photoresist 52 may precede or follow the doping step, depending on the doping method utilized.

Next, the wafer is thermally oxidized to grow a thermal crossover oxide 60 on the unprotected portions of the source and drain regions (i.e. bare silicon 32). The silicon nitride portection layer 42 prevents thermal oxidation in those associated protected areas. Hence, selective thermal oxidation is performed while the portions of the silicon nitride layer 42 remain in place defining the contact areas to the source, drain and gate regions, preventing the development of any thermal oxide thereover. Ultimately, these remaining portions of the silicon nitride layer 42 are selectively removed such as by a dip etch which has no effect on the exposed oxide surfaces, thereby to expose those corresponding contact areas and thus afford self-aligned contacts to the source, drain and gate regions.

Figure 11:
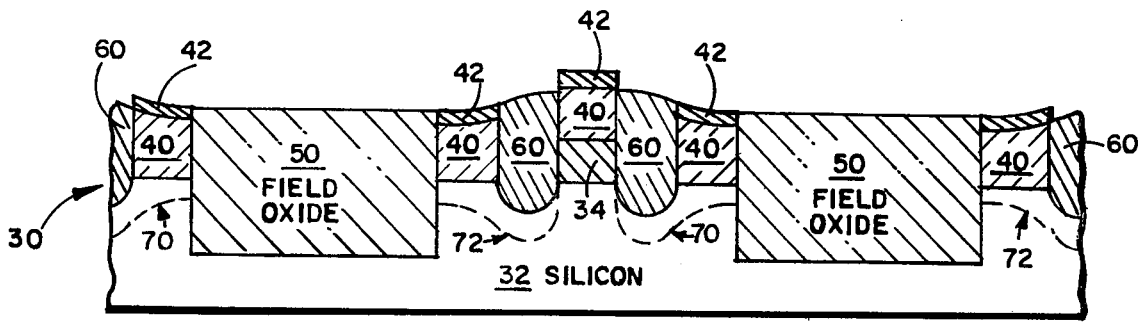

During the thermal oxidation for developing the crossover 60, the dopant introduced in the source and drain doping step will diffuse deeper into the monocrystalline silicon 32 and laterally within the monocrystalline silicon 32 and thus slightly under the gate oxide 34 under the polysilicon 40 of the gate. In fact, once the polysilicon layer 40 is deposited, on each subsequent occasion of heating the wafer to a temperature which is sufficient to induce dopant diffusion within the monocrystalline silicon 32, some of the dopant in the polysilicon 40 diffuses into the portions of the monocrystalline silicon 32 in contact therewith. During the oxidation step for developing the crossover oxide 60, therefore, impurities introduced into the silicon 32 from the doped polysilicon 40 diffuse further within the monocrystalline silicon 32 and create continuous source and drain regions 70 and 72 (shown in FIG. 11) at the corresponding polycrystalline-to-monocrystalline-silicon contact regions 38. Each of these regions 70 and 72 extends from under the polysilicon gate (34) out to the corresponding field oxide portions 50. However, if process temperatures are kept low, lateral diffusion can be reduced to a negligible amount, if so desired or preferred. Once the crossover oxide 60 has grown to a desired thickness, the thermal oxidation is stopped. The desired thickness may be one which minimizes surface discontinuities between the polysilicon 40 over the source and drain regions and the polysilicon gate, or one which minimizes crossover capacitance, or some other thickness. At the end of the thermal oxidation step, the wafer appears in cross-section as shown in FIG. 11.

There thus are provided at the surface, either an oxide (and particularly silicon dioxide), such as from the field oxide regions 50 or the crossover 60, and selected small portions of the silicon nitride layer 42 covering contact areas to the source, drain and gate regions.

These remaining portions of the silicon nitride layer 42 are removed by selective etch to expose the underlying surface of the polysilicon layer 40 in the associated source, drain and gate regions. These exposed portions of the polysilicon 40 thus constitute self-aligned contact sites.

Figure 12:
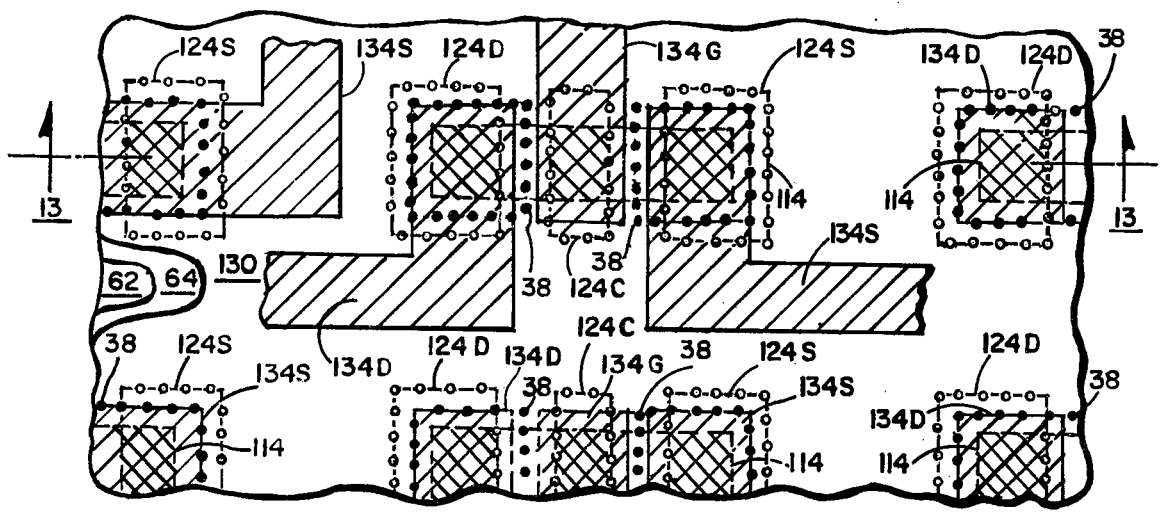

A conductive material 62 such as metal or polysilicon is then deposited on the wafer. A photoresist layer 64 is provided on conductive material 62 and exposed to actinic radiation through a metallization mask 130 which delineates the geometry of the conductive material. Wherever it is desired to retain contact material 62, mask 130 has protective areas 134 which render the photoresist 64 thereunder nonsoluble. A portion of mask 130 is illustrated in FIG. 12. Areas 134D, 134G and 134S define the portions of conductive material 62 which will be connected to the drain, the gate and the source, respectively, of individual field effect transistors. The areas 134D, 134G and 134S over the respective drain, gate and source regions respectively are of substantially greater lateral and length dimensions than the corresponding contact regions themselves. This is made possible by the isolation, or electrical insulation, afforded by the field oxides 50 and the crossovers 60, which permit these contacting areas to overlap from the contact regions themselves onto the adjacent oxide surfaces without any deleterious effect and particularly without any concern of shorting. Since these contacting metallized areas are defined by a single masking step, alignment between those contacts associated with a source and a drain versus that associated with a gate is assured, and so long as a given contact area makes substantial contact with associated contact region, adequate electrical connection to all areas will be accomplished. In general, the only limitation is that the mask cannot be so far out of line such that one contact area overlaps from its intended contact region, extending not only across an intervening insulator (e.g. the crossovers 60) but also into overlap positions on an adjacent contact region. Conventional manufacturing techniques are adequate for avoiding such an extreme case of mask misalignment which could render this result.

Ideal alignment between the areas 134 of mask 130 and the already existing structure is illustrated by the position of the underlying areas 38, and the positions previously occupied by protective areas 114 and 124 of masks 110 and 120, respectively. It will be understood that the actual areas present in the underlying structure do not correspond to the outlines 38, 114 and 124, but were determined by them at least initially. In particular, the areas 38 have been changed by the subsequent applications of (1) the isolation mask 110 which delineated changes in the location of three of the four boundaries of each region 38 and (2), and the mask 120 which delineated changes in the location of the remaining original boundary of the areas 38. In fact, for this ideal alignment illustration of FIG. 12, the drain, gate, and source contact regions, as they relate to the corresponding metallization areas, are encompassed in an evenly spaced, symmetrical manner by the metallization in those areas shown by the doubly cross hatched regions. It will thus be apparent from FIG. 12 that substantial misalignment of the mask may occur, yet, nevertheless, adequate electrical contact of the metallization areas on the exposed contact regions will be achieved, without concern of shorting.

Further, so long as mask 120 was properly aligned within mask alignment tolerances, the alignment of mask 130 in the direction "A" has substantial latitude, so long as a line from the center of the drain of each device to the center of the source of the same device is parallel to the direction "B".

Mask 130 must be aligned in direction "B" so that the gap between areas 134D and 134G of each device lies significantly on the crossover oxide 60. It is also necessary that the gap between areas 134G and 134S lies significantly on the crossover oxide 60. Proper alignment of the gap between 134D and 134G assures proper alignment of the gap between 134G and 134S. In this case what is meant by "lies significantly on the crossover oxide" is that a sufficient portion of that gap is on the oxide to assure that those conductive regions defined by areas 134D, 134G and 134S contact the area they are intended to contact and do not contact or short to the adjacent areas they are not intended to contact.

Figure 13:
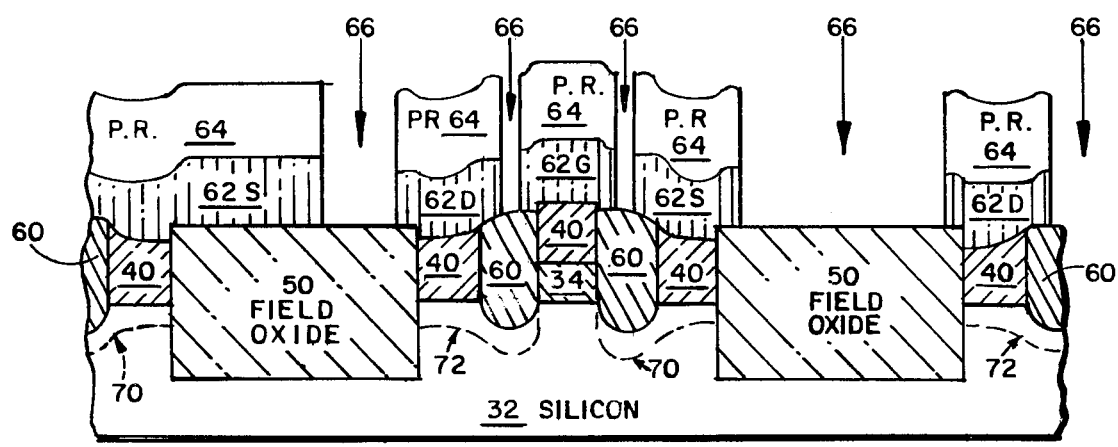

Once photoresist 64 has been exposed to actinic radiation through mask 130, the photoresist is developed. The removal of the soluble resist by the development process creates troughs 66 (as shown in FIG. 13) between the retained portions of the photoresist 64. The portions of conductive layer 62 which lie in the troughs 66 are not protected by the remaining photoresist 64. These unprotected portions of layer 62 are removed in an appropriate manner, thereby creating individual conductive lines. At this stage, the wafer appears as in FIG. 13. The remaining portions of photoresist layer 64 are preferably removed after the unprotected portions of layer 62 are removed.

If additional conductive layers are desired in the final device, a layer of dielectric material may be deposited or formed on the wafer. Apertures may then be formed in the dielectric layer using photoresist or other masking techniques followed by removal of the dielectric material where contact is desired between the additional conductive layer and conductive regions formed earlier. The additional conductive layer is then deposited and delineated using an additional metallization mask to control the location and pattern of the portions of the additional conductive layer which are to be retained.

In the various removal steps, any removal technique may be utilized so long as it does not irremediably harm the devices being fabricated so as to make them unusable. Techniques which may be used for some removal steps include, inter alia, wet chemical etching, ion milling, plasma etching, chemical conversion, and so on. For maximum device density, it is preferred to select removal techniques which will minimize device dimensional variations.

In accordance with this device fabrication process, mask alignment tolerances control the minimum device size which it is practical to utilize in integrated circuits fabricated on a wafer. There is no limit on the process. The technique of this invention makes practical devices having conductive-layer-to-active-device contacts directly over the device active regions. That is, the source and drain contacts to the polysilicon source and drain are directly over the source and drain regions and the contact between the conductive layer and the polysilicon of the gate is directly over the active portion of the gate. This fabrication technique makes feasible a substantial increase in density of devices in an integrated circuit. This increase in density is particularly applicable to and beneficial to memory circuits because of the uniform pattern of connections and crossovers present in such circuits as a result of the repetition of the same basic building block throughout a rectangular matrix.

It will be understood that this fabrication process achieves self-aligned gates and self-aligned contacts in minimum geometry structures. Although the main description is in terms of bulk silicon, it will be understood that it is appropriate also to silicon on sapphire and is appropriate to NMOS, CMOS, and PMOS as well as MNOS devices and both devices utilizing metal conductive layers and devices using polysilicon conductive layers.

By way of example, field effect transistors have been formed in accordance with the invention utilizing materials and thicknesses in the following general thicknesses. Where the silicon 32 is a layer on a different substrate, a thickness of 1.5-2.0 microns is appropriate. The silicon dioxide layer 34 which forms the gate dielectric may be from 600 to 1,000 Å. The polysilicon layer 40 may be of about 5,000 Å in thickness. The silicon nitride layer 42 may be about 400 Å in thickness. The field oxide 50 may be from 10,000 to 15,000 Å. The crossover oxide 60 may be from 5,000 to 10,000 Å. The thicknesses of course will vary with the desired characteristics of the devices to be fabricated.

Figure 14:
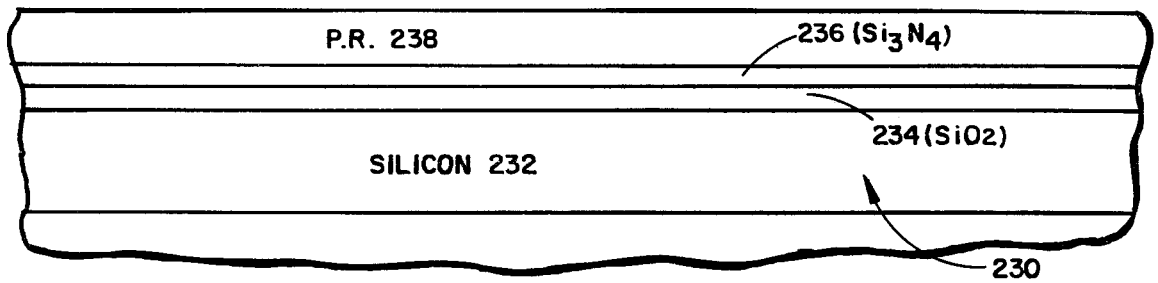
FIG. 14 is a cross-sectional view through a semiconductor wafer having a thermal oxide layer thereon and including a photoresist layer for selective masking of the thermal oxide layer in the initial stage of device fabrication on the wafer.

An alternative embodiment of the process hereinabove set forth is also possible in accordance with the following discussion of FIGS. 14 through 24. In FIG. 14, a silicon substrate 232 generally corresponding to the silicon 32 of FIG. 1, has thermally grown thereon a layer of silicon dioxide 234 over which is deposited a silicon ($Si_3N_4$) layer 236. A photoresist layer 238 is placed on the layer 236 and exposed through the mask 300 shown in FIG. 15.

Figure 15:
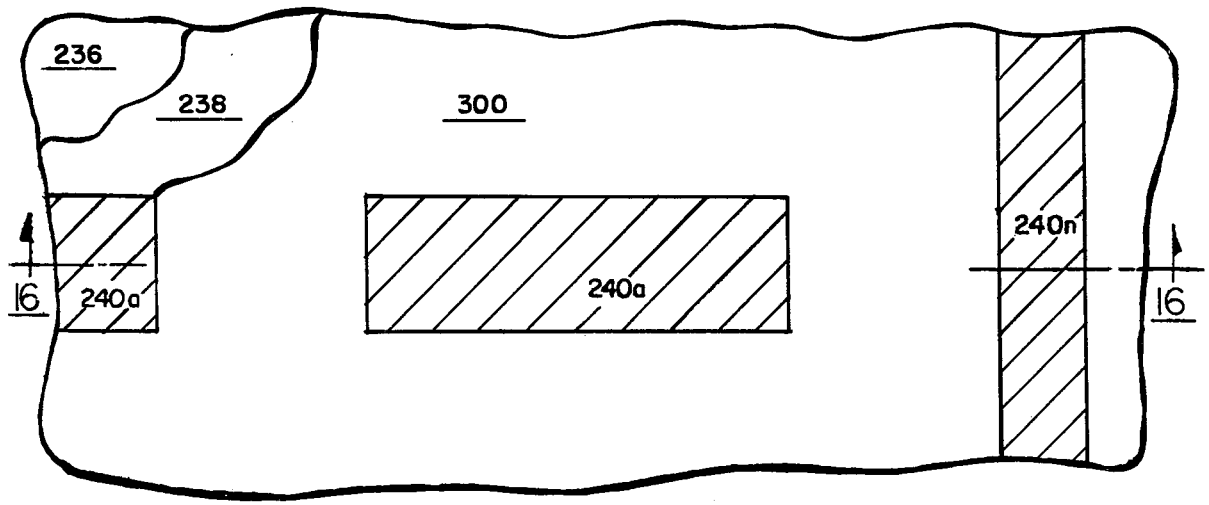
FIG. 15 is a plan view of a portion of a mask for defining selected areas of the substrate in which active devices and diffused lines are to be formed, the protective portions being indicated by cross-hatching; the non-protective areas correspond to areas of the substrate on which a field oxide is to be developed.

The mask 300 of FIG. 15 includes areas 240 to protect the underlying photoresist in subsequent, conventional processing, the remainder of the photoresist 238 being removed and thereby exposing the underlying silicon nitride layer 236 to permit removal, e.g., by successively etching of the exposed nitride 236 and the underlying silicon dioxide layer 234. Illustratively, portions 240a and 240a' define locations of active devices to be formed, and 240n defines the location of an N+ diffused conductive line to be formed.

Figure 16:
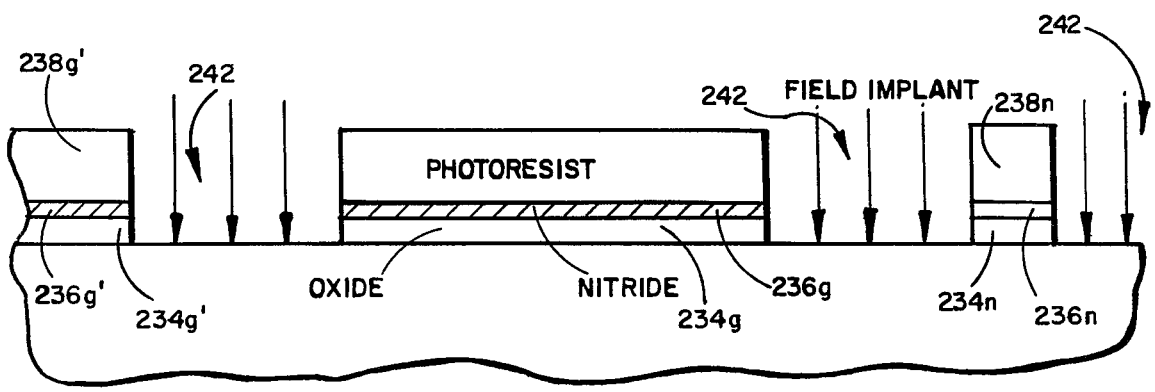
FIG. 16 is a cross-sectional view of the structure following processing in accordance with the mask of FIG. 15, further indicating an ion implant operation for developing the field inversion layer underlying the region of the field oxide to be formed.
Figure 17:
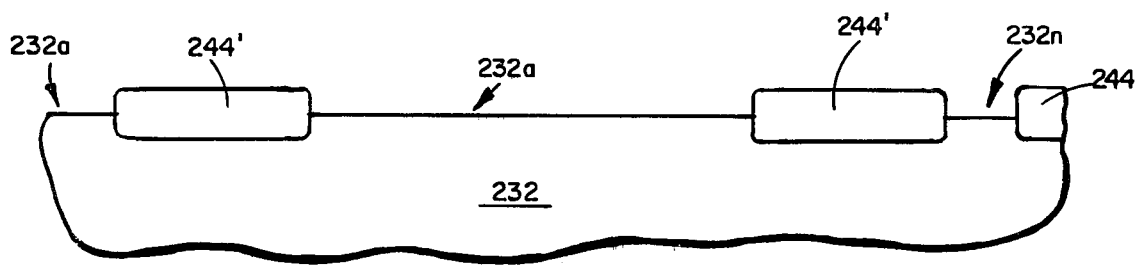
FIG. 17 is a cross-sectional view as in FIG. 16, following development of the field oxide and stripping of the photoresist layer portions and underlying protected portions as seen in FIG. 16.

FIG. 16 illustrates the resulting structure wherein, by reference to the initial cross section of FIG. 14, there remain the protected portions of the photoresist layer 240, and the underlying portions of the silicon nitride layer 236 and the silicon dioxide layer 234, all of which have been removed in the areas 242 to expose the surface of the silicon substrate 232. Particularly, a first active device, e.g., a field effect transistor, will be formed in the central portion comprising the photoresist 238a and the underlying nitride 236a and oxide 234a. In FIG. 16, to the left of the central portion for forming a first active device, is shown a similar structure containing corresponding layers 238a', 236a', and 234a' which may represent an adjacent active device—e.g., likewise a field effect transistor. To the right of that same central portion in FIG. 16 is a relatively narrow cross section of corresponding layers 238n, 236n and 234n overlying the region of an N+ diffused line in the substrate which, in the preceding FIG. 15, is defined by mask protective portion 240n and extends in elongated fashion along the planar surface of the silicon substrate 232.

The composite as thus configured in FIG. 16 is subjected to a field implant for doping of the silicon 232 in the exposed areas 242, thereby to provide field inversion regions, or electrical isolation barriers, in the silicon substrate 232 for isolating the active devices and the N+ lines to be formed in the corresponding, displaced areas of the silicon substrate 232. The remaining portions of the photoresist layer 238, mask and thereby protect the underlying layers 236 and 234, and the corresponding substrate surface from the ion implant.

Thereafter, the photoresist portions 238 preferably are removed, leaving exposed the previously protected, remaining portions of the nitride layer 236. The wafer then is subjected to thermal oxidation for developing a field oxide 244 over the entire, exposed surface of the silicon wafer 232 and thus on all portions thereof which have not been protected by the remaining portions of the nitride layer 236. Following the thermal oxidation step, the remaining portions of the nitride protection layer 236 and the respective, underlying portions of the oxide layer 234 are removed (e.g., by chemical batch etching as discussed hereinabove). The resulting structure is shown illustratively in cross section in FIG. 17 in which the silicon 232 is exposed at areas 232a and 232a' at which active devices will be formed, and at area 232n at which the N+ line will be formed, separated and isolated by field oxide portions 244. It is significant that the nitride layer portions 236 in FIG. 16 served as an oxidation mask and prevented the development of any substantial thermal oxide thereover during the development of the field oxide 244. A subsequent dip, or batch, etch then permits selective removal of the nitride layer portions without affecting the field oxide. The field thermal oxidation may form a thin oxide surface layer (silicon oxynitride) on the nitride layer 236 which may be removed readily by an oxide etch having little effect on the field oxide 244. Similarly, the initial silicon dioxide layer 234 is sufficiently thin that its removal by a batch or dip etch, for example, (and thus without use of a mask) has only minimal effect on the field oxide 242.

Figure 18:
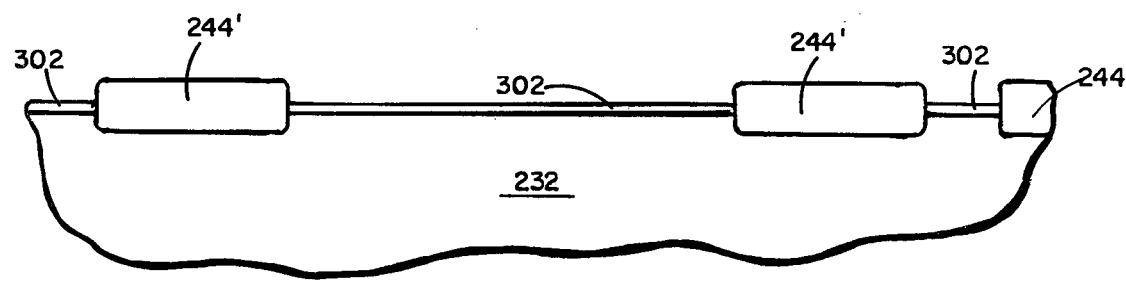
FIG. 18 is a cross-sectional view as in FIG. 16, illustrating development of a new thermal oxide layer, a portion of which will form the gate dielectric, and active device.

The step of removing the original silicon dioxide layer 234 is optional, but preferably is performed, since in the etching of the nitride, the surface of the silicon dioxide layer can be etched somewhat, rendering it imperfect or irregular. Thus, the new thermally grown layer of silicon dioxide 302 formed on the exposed surface of the silicon 232, shown in the cross-sectional view of FIG. 18, is relatively uniform and smooth. A portion of silicon dioxide layer 302 will form the gate oxide, or dielectric, of an FET.

Figure 19:
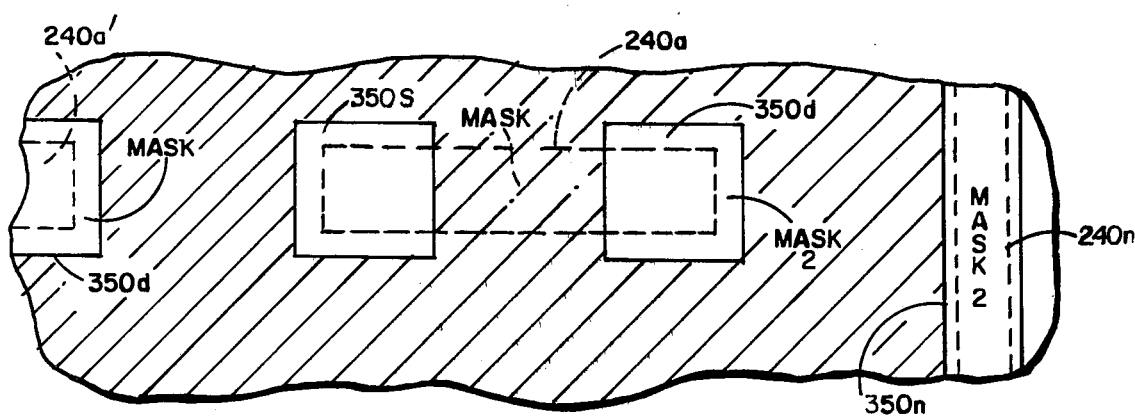
FIG. 19 is a plan view of a mask for removing portions of the thermal oxide of FIG. 17 from the surface of the silicon substrate to expose that surface to prevent electrical contact thereto.

A photoresist (not shown) is deposited over the surface of the structure of FIG. 18 and exposed through the mask 350 shown in plan view in FIG. 19. The mask 350 protects the underlying photoresist in the areas underlying the cross-hatched portion of the mask, but permits removal of the photoresist and subsequent removal of the underlying silicon dioxide layer 302 in the non-cross-hatched portions of the mask so as to define areas, or windows, through which the the surface of the underlying silicon layer 232 is exposed to permit electrical contact thereto. Thus, illustratively, the non-protective mask portion 350s provide for opening a window to the surface of the silicon 232 for forming the source region of an FET. In like fashion, portion 350d of the mask 350 permits opening a window to expose the silicon 232 for forming the drain region of an FET, and portion 350n permits exposing the surface portion 232n of the silicon 232 for the N+ diffused conducting line.

The selected areas of the silicon 232 on which active devices and N+ lines are to be formed were defined by mask portions 240a and 240n of the mask 300 (FIG. 15) are shown by dotted lines in FIG. 18 with respect to the non-protective areas 350s and 350d of the mask 350, thereby to illustrate the extent of the alignment requirements imposed by this process. Particularly, the regions 350s and 350d may be substantially larger than those associated areas defined by the mask portion 240a, and will serve to open windows through the new silicon dioxide layer 302 to the underlying surface of the silicon substrate 232 for forming source and drain regions of an active device, and the N+ conducting line area. The remaining portion of the oxide layer 302 intermediate the source and drain regions will provide the gate dielectric portion of the active device. Thus, the alignment tolerance imposed essentially is that these enlarged non-protective areas 350s and 350d contain therewithin a substantial portion of those respective, opposite end portions of the gate oxide layer 232 to permit defining the source and drain regions within the area 240a defined by mask 300, and that the protected area therebetween, which defines the portion of oxide layer 302 which will remain to provide the gate dielectric, is generally centrally located in the area 240a.

The mask portion 350n, likewise, is of enlarged size to encompass the area of the substrate 232 wherein an N+ conducting line is to be formed, for selective removal of the oxide layer 302.

Overlap onto the surrounding field oxide 244 of the non-protective areas 350s, 350d, and 350n is permitted since the oxide layer 302 to be removed is significantly thinner than the field oxide 244 and thus the portions of the latter exposed through the enlarged mask openings are not etched to any great extent.

Using conventional photoresist exposure and removal steps as regards the photoresist exposed through the mask 350, and a subsequent silicon dioxide removal step for removal of the exposed oxide layer 302, there results a composite structure of the silicon substrate 232 having a silicon dioxide layer 302g which will form the gate dielectric and corresponding in its lateral dimensions to the protected area between the window portions 350s and 350d of the mask 350 (as seen in FIG. 19), and exposed areas 232s and 232d of the substrate surface, separated by the oxide 302g and extending to the surrounding field oxide portions 244' and 244", and an exposed area 232n of the substrate 232, likewise bordered by the field oxide 244. These elements are seen in the cross-sectional view of FIG. 20 which illustrates the composite structure, following further processing steps. These steps include the deposit of a doped polysilicon layer 352 over the entire above-described surface and thus over the field oxide 242, the silicon dioxide layer 302g and the exposed surfaces of the substrate 232s, 232d, and 232n. Furthermore, a nitride layer 354 is deposited over the polysilicon layer 352. Thereafter, a conventional drive is performed to produce the diffused, doped source and drain regions 356s and 356d, and the N+ doped line region 356n indicated by dotted outline in the cross section of FIG. 20.

Figure 21:
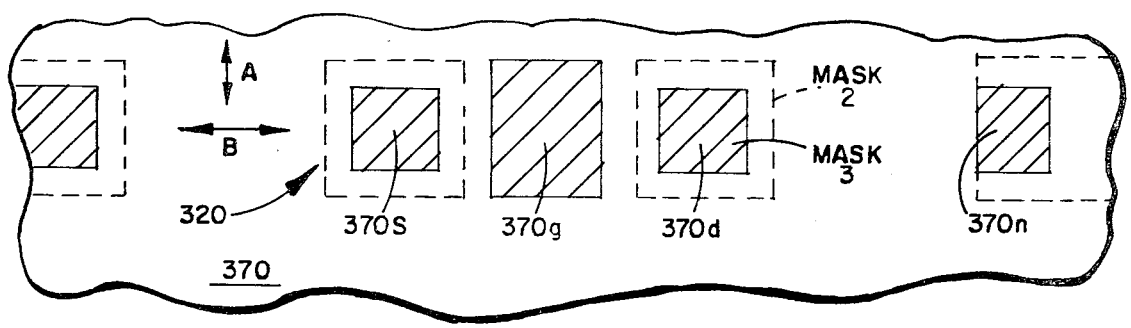
FIG. 21 is plan view of a mask for delineating self-aligned contacts to the source, gate, drain, and N+ diffused line.

FIG. 21 illustrates a further mask 370 having protective portions 370s, 370g, and 370n respectively defining electrical contact areas to the source, gate drain and N+ line. These protective portions as well determine the perimeter of the corresponding portions of the underlying polysilicon layer 352 which will be retained for making electrical contact to the source, gate, drain, and N+ lines of the composite structure and in fact define the final gate dielectric lateral dimension.

FIG. 21 also illustrates the alignment conditions of these protective areas of mask 370 relative to the mask windows 350s and 350d of mask 350 of FIG. 19 and of portions 240a and 240n of mask 240 of FIG. 15. In a manner similar to that above discussed, exposure of a photoresist through mask 370 results in protective areas of photoresist covering corresponding portions of the underlying nitride layer 354 and the associated portions of the underlying polysilicon layer 352. Accordingly, after a subsequent photoresist exposure and removal operation, successive nitride and polysilicon batch etches and removal of those protective photoresist portions, there results the structure shown in cross section in FIG. 22.

As a result of the etching performed through mask 370, the remaining nitride layer portions, or buttons, 354s, 354g, 354d, and 354n are inherently aligned with the contacts afforded by the upper surfaces of the polysilicon layer portions 352s, 352g, 352d, and 352n, respectively. These upper surfaces, as will be seen, comprise self-aligned contacts to the respectively corresponding source region, gate dielectric, drain region, and N+ line contact position.

Figure 20:
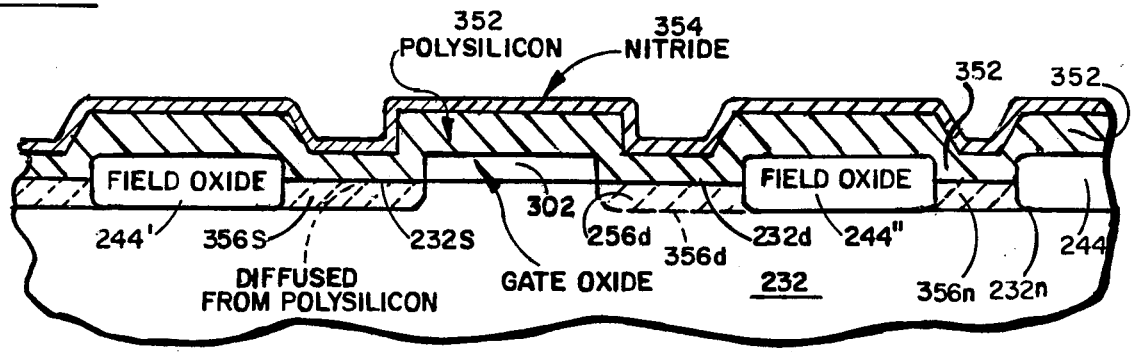
FIG. 20 is a cross-sectional view as in FIG. 17 illustrating the structure of the wafer following processing in accordance with the mask of FIG. 19 and further including deposited polysilicon and nitride layers thereon.

The gate mask portion 370g of mask 370 is somewhat narrower than the remaining oxide layer 302 in FIG. 20, although extending beyond the width of the oxide layer 302, to assure that the protected portion of polysilicon 354 underlying same will fully extend over the underlying gate dielectric.

In the etch through mask 370, therefore, the final lateral dimension of the gate dielectric 302g is determined. This opens troughs 360 to the surface of the silicon substrate 232.

Figure 22:
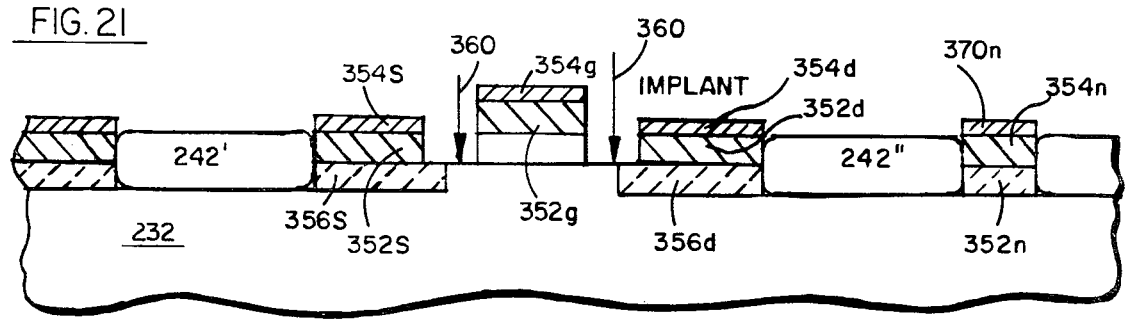
FIG. 22 is a cross-sectional view as in FIG. 20 illustrating the structure of the wafer following delineation in accordance with the mask of FIG. 21 and illustrating an ion implant step for establishing source and drain regions of the active device.

As shown in FIG. 22, the exposed silicon 232 in the troughs 360 is subjected to an ion implant for establishing the source and drain doped regions, generally in relation to the regions 356s and 356d as previously established by diffusion from the doped polysilicon layer 352, as seen in FIG. 20. The photoresist (not shown) over the nitride button 354g masks the gate during this ion implant step. Thus, the gate is now self-aligned and includes a self-aligned contact on the surface of the polysilicon portion 352g, covered by the nitride button 354g.

After removal of the photoresist, the composite structure is as seen in cross-section in FIG. 21. It then is subjected to thermal oxidation so as to develop crossover oxides 362, 364 in the troughs 360 (as seen in cross-section in FIG. 24) and to develop an oxide layer over the surface of the exposed N+ line polysilicon layer 354n and over all other exposed silicon surfaces, except for those contact areas protected by the nitride buttons. Thereafter, the nitride buttons are removed by a batch etch which selectively removes nitride but does not attack the exposed silicon dioxide, thereby exposing the surfaces of the self-aligned contact areas.

It will now be seen that a substantial tolerance to mask misalignment in the lateral direction ("B" in FIG. 21) is afforded. Principally, the gate mask portion 370g (FIG. 20) must be within the boundaries of the gate oxide layer 302 seen in FIG. 20 and defined by mask 350 (FIG. 19). Mask portions 370s and 370d need only delineate polysilicon portions 352s, 352d, and 352n of sufficient extend to afford good electrical connection to their corresponding source, drain and N+ line regions of the surface of the substrate 232. Any displacement of the mask in the "B" direction will merely cause overlap of polysilicon onto the adjacent field oxide. Any concomitant opening between the polysilicon and an adjacent field oxide, caused by such mask misalignment, will be filled with thermally grown silicon dioxide, by the termal oxidation step which produces the cross-over oxides 362 and 364.

Figure 23:
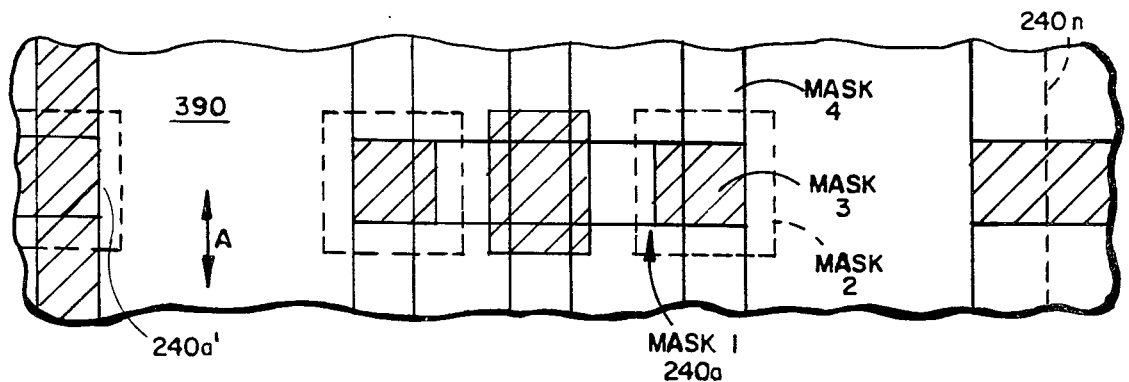
FIG. 23 is a plan view of a metalization mask for delineating a metalization layer applied over the wafer structure to make electrical contact to the self-aligned contacts of the active device and conductive line formed on the wafer surface.

A metalization layer and a photoresist layer then are applied over the surface of the device structure shown in FIG. 21 and a contact mask 390, shown in FIG. 23, then is placed over the photoresist. The protective areas of mask 390, indicated by cross-hatching, protect the underlying metalization layer in a subsequent metal removal step. There result independent electrical conduction lines 370s, 370g, 370d, and 370n extending over and connecting to the self-aligned contacts of the source, gate, drain, and N+ diffused line, respectively. In this instance, the width of each metal conducting line, is selected so as to lie within the corresponding dimension of the exposed contact surfaces.

Figure 24:
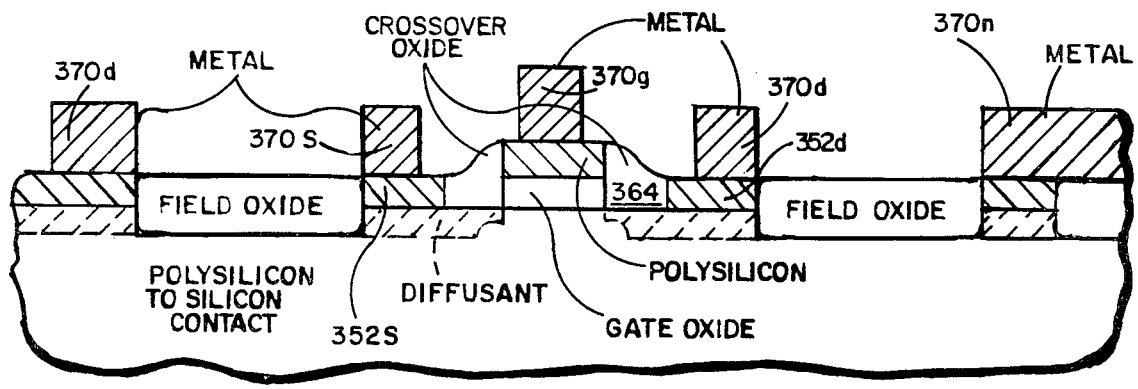
FIG. 24 is a cross-sectional view as in FIG. 21, illustrating further structures produced thereon by thermal oxidation of the structure as shown in FIG. 21 and furthermore illustrating the delineation of a metalization layer in accordance with the mask of FIG. 23, producing metal conductive lines to the self-aligned contacts.

The resulting structure is shown in cross section in FIG. 24, wherein the metal conductive lines 370s, 370g, 370d, and 370n are seen to correspond in position to those protective portions of the mask 390, the lines making connections to the corresponding source, drain, gate, and N+ line polysilicon contacts. As shown illustratively in FIG. 24, the cross-over oxide 392 extends at least to the height of the source and drain polysilicon contact portions 352s and 352d and to the height of the gate polysilicon contact portion 352g, to prevent any shorting by inadvertent contact of subsequent metalization between the gate and source, or between the gate and drain, contact areas.

As in the prior, first-discussed embodiment, the nitride buttons serve not only to protect the surfaces of the contact areas during thermal oxidation, but also can be selectively removed by a batch etch and thus without masking and attendant alignment problems, for exposing the contact areas. The nitride buttons furthermore serve to establish the boundaries and location of the polysilicon portions in contact with the various active device regions and to the N+ line. Thus, the single masking step which establishes the nitride buttons serves to afford self-aligned contacts to these regions. The configuration of the device moreover is seen to provide substantial tolerance to misalignment of masks while still affording an operative device.

With reference to FIGS. 23 and 24, therefore, it again will be seen that substantial latitude exists with regard to the metalization mask 390 for assuring that adequate contact to the exposed contact areas is afforded. As to the active device, that alignment tolerance is particularly great in the A direction, since the conductive lines to the source, gate and drain may extend in a parallel direction, affording direct contact over those contact areas for the corresponding elements of the active device. Redirection of the metal contact line 370n to this same parallel direction of course would increase the latitude of mask misalignment tolerance with respect to achieving contact of the metalization to the N+ line contact area.

Following the definition of the metal conductors, the structure, substantially as seen in FIG. 24, may then receive a passivation layer in conventional fashion.

Figure 25:
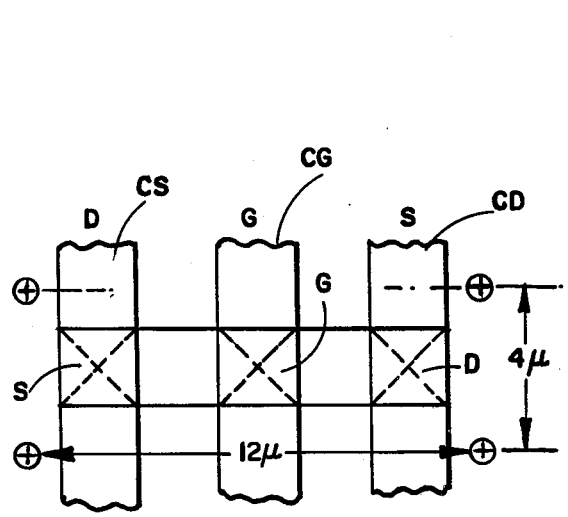
FIG. 25 is a plan view of a field effect transistor and related metal conductive lines formed in accordance with the process of the invention.

FIG. 25 illustrates the device as shown in either of FIGS. 13 or 24, illustrating only the transistor structure and associated conducting lines. The source, gate, and drain contact areas are identified by the letters S, G, and D, respectively. The metal conductive lines associated with these contact areas are similarly labelled CS, CG, and CD. From the earlier FIGS. 13 and 24, it will be understood that the conductive lines overlie these respective contact areas and are in substantial alignment therewith. The width of the conductive lines may be somewhat smaller or substantially the same width or somewhat wider than the respective contact areas. The size dimensions of 4 microns by 12 microns provide an illustration of the size device which can be realized in the practice of the process of this invention.

Figure 26:
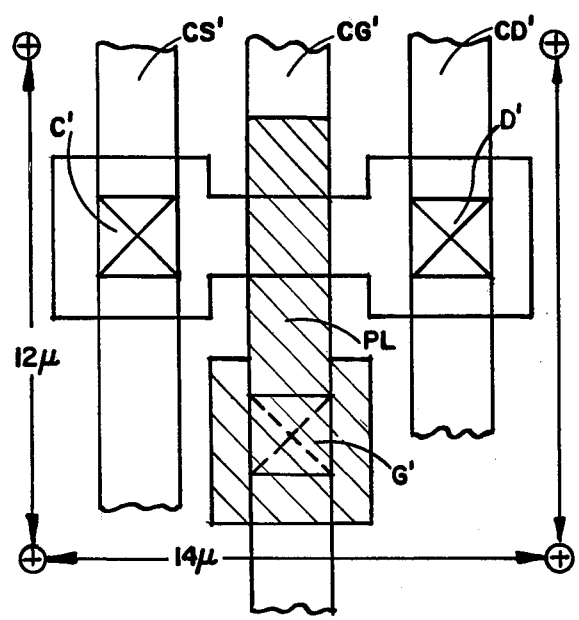
FIG. 26 is a plan view of a prior art field effect transistor, for purposes of comparison of the size reduction achieved by the process and resulting structure of the invention.

FIG. 26 illustrates a prior art structure wherein the same elements are identified by primed letters otherwise corresponding to those of FIG. 25. The prior art structure does not have the self-aligned feature nor the self-aligned features of the structure of the invention and, in conventional fashion, requires a remote gate contact as shown at G' connecting to the actual gate area through a polysilicon line PL. The remote gate contact G' is required due to the need to provide additional area for mask misalignment and other limitations of prior art processes as discussed hereinabove.

The substantial size reduction and concomitant reduction in transistor area achieved by the process of the invention is apparent by comparison of FIGS. 25 and 26. Whereas the prior art structure requires (12×14 square microns, or 168 square microns) the device of the invention in FIG. 25 utilizing self-aligned contacts and gates requires a transistor area only of (4×12 square microns or 48 square microns). This permits a 3.5 times increase in density. The process of course is not limited to this dimension and even more substantial size reduction may be achieved.

Figure 27:
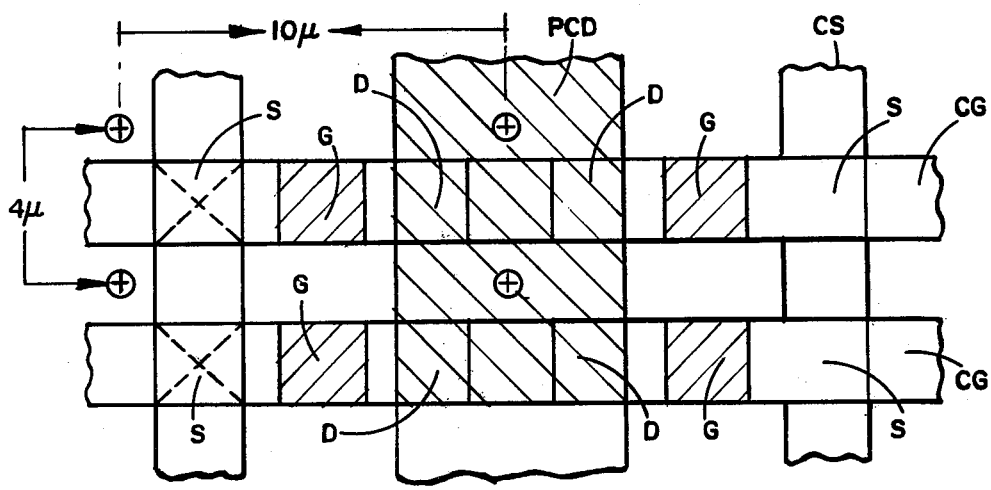
FIG. 27 is a plan view of field effect transistors formed in accordance with the invention and connected in a memory cell configuration.
Figure 28:
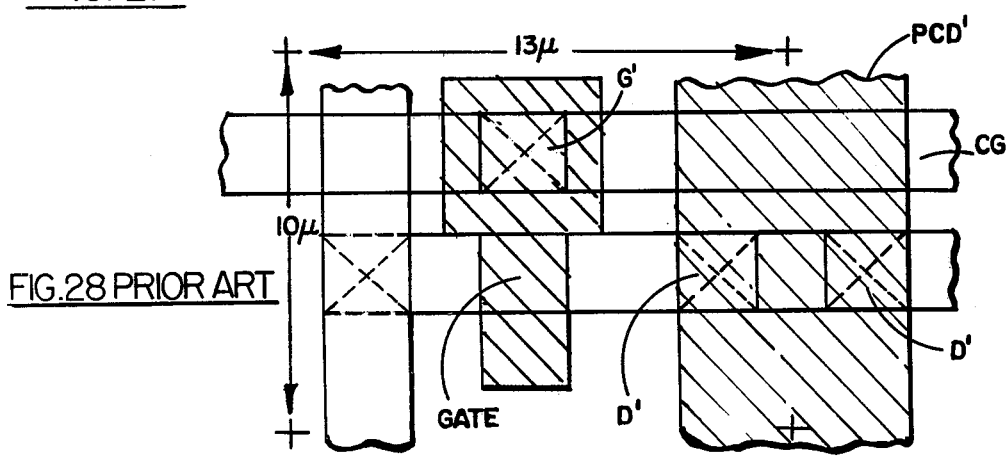
FIG. 28 is a plan view of a prior art field effect transistor for purposes of illustrating the size reduction achieved by the process and resulting structure of the invention.

FIGS. 27 and 28 illustrate transistor memory cell devices utilizing field effect transistors formed in accordance with the invention in the case of FIG. 27 and in accordance with the prior art in FIG. 28. The same identifying letters are applied in these figures as in FIGS. 25 and 26, respectively.

FIG. 27 illustrates four transistors in accordance with the invention connected in a memory cell configuration and having matrix-type conducting lines. Metal conducting lines CS connect to multiple source contacts S whereas metal conducting lines CG connect to the gate contacts G. A common drain connection which is cross-hatched to indicate polysilicon provides common connection to the drains D of the adjacent columns of the transistors. An illustrative size of 40 square microns is required for each transistor and this memory cell configuration.

Conversely, only a single transistor of the prior art type is shown in FIG. 28 requiring in this instance 130 square microns of area. In the memory cell configuration of this example, the transistor of the invention affords a 3.25 increase in density.

It will be understood that the intersecting points of the various conductive lines CS, CG, CD, and PCD in FIGS. 25 and 27 (and their primed equivalents in FIGS. 26 and 28) are suitably insulated one from another at all areas of intersection.

The process of the invention and the resulting transistor structures achieved thereby have numerous desirable features and related applications. They are compatible with VLSI circuit technology. Wet or dry processing techniques may be employed for the various etching functions. Double layer polysilicon structures may be employed with necessary further masking and other steps, as will be apparent. P-channel, N-channel and CMOS can be implemented with this technology. These and other advantages hereinbefore set forth will suggest to those of skill in the art numerous other applications and variations of the process here set forth.

Numerous modifications and adaptation of the processes and resulting structures of very large scale integrated circuits (VLSI) formed in accordance with this invention will be apparent to those of skill in the art and thus it is intended by the appended claims to cover all such modifications and adaptations which fall within the true spirit and scope of this invention.

We claim:

1. A process for providing a self-aligned contact to the gate of a field effect device having source, gate and drain regions and formed on a predetermined area of a silicon semiconductor substrate, said gate comprising a gate electrode formed on a gate dielectric in turn formed on the gate region, said gate region extending across said predetermined area generally centrally thereof and defining said source and drain regions in the remaining portions of said selected area, comprising the steps of:

forming an oxide layer of greater width than said gate and extending across said predetermined area covering said gate region, forming a layer of polysilicon at least over said oxide layer, forming a silicon nitride layer on said polysilicon layer extending over said selected area of said substrate, selectively removing portions of said silicon nitride layer so as to define a remaining silicon nitride gate button extending across said predetermined area in alignment with said oxide layer and of the width of said gate, removing portions of the polysilicon layer exposed by the removal of said portions of said nitride layer and removing any portions of said dielectric layer exposed by removal of said portions of said polysilicon layer, said dielectric layer thereby being conformed in width to the desired width of said gate, and said substrate surface being exposed in first and second portions respectively underlying the removed portions of said silicon nitride, polysilicon, and dielectric layers, doping said substrate at said exposed surfaces thereof, forming an oxide of said substrate material on said exposed portions of said substrate and contiguous with said gate, extending at least to the level of said silicon nitride gate button, and removing said gate nitride button by a material selective removal process which has substantially no effect on the material of, or on oxides of the material of said substrate, thereby to expose the surface underlying said gate nitride button as a self-aligned contact to said gate electrode;

said process further forming a diffused conducting line in said substrate surface in a second selected area isolated from said first selected area, further comprising the steps of:

simultaneously applying said layer of polysilicon over said second selected area, simultaneously providing a silicon nitride layer over said polysilicon layer over said second selected area, simultaneously delineating said silicon nitride button overlying said polysilicon layer in said second selected area at a desired position, simultaneously removing the portions of the polysilicon layer over said second selected area exposed by removal of said silicon nitride layer thereby to retain only that portion of said polysilicon layer over said second selected area underlying said diffused conducting line contact button thereby to expose the corresponding underlying portion of said substrate in said second selected area, simultaneously oxidizing said exposed surface portion of said substrate in said second selected area, and simultaneously removing said diffused conducting line nitride button to expose the underlying surface of said remaining polysilicon layer portion and afford thereby a self-aligned contact to said diffused conducting line.

2. A process for providing self-aligned gate, drain and source contacts to a field effect device to be formed on a silicon semiconductor substrate within a predetermined area thereof surrounded by isolating field oxide, said device including a gate of a predetermined width extending across said selected area generally centrally thereof and comprising a gate dielectric and a gate electrode, comprising the steps of:

forming an oxide layer on the surface of said substrate, delineating said oxide layer to expose said substrate in first and second portions thereof within said predetermined area corresponding to said source and drain regions of said device and including a portion of said oxide layer extending generally centrally across said predetermined area intermediate said first and second portions thereof, forming a polysilicon layer extending over said generally centrally extending oxide layer and over said exposed surfaces of said substrate corresponding to said source and drain regions thereof, forming a silicon nitride layer on said polysilicon layer and extending over said selected area of said substrate, thermally oxidizing said substrate so as to form a field oxide region surrounding and isolating said selected area, contiguous with said polysilicon layer on said selected area thereof, delineating said nitride layer so as to define a silicon nitride gate button extending at least across said selected area and of the desired width of said gate of said device and to form source and drain silicon nitride buttons extending across said selected area in alignment with said first and second portions thereof to overlie said source and drain regions of said device, and removing the portions of said silicon nitride layer intermediate said gate and source, and said gate and drain silicon nitride buttons so as to expose portions of said polysilicon layer therebetween, removing the exposed portions of said polysilicon layer and removing any portion of said gate dielectric layer exposed by removal of said portions of said polysilicon layer so as to expose corresponding portions underlying said substrate surface contiguous said gate electrode, forming an oxide covering said exposed surface portions of said silicon semiconductor substrate and extending at least to the height of said silicon nitride gate button on said gate polysilicon layer, and removing said source, gate, and drain silicon nitride buttons to expose the respectively underlying surfaces as self-aligned contacts to said source, gate and drain regions respectively.

3. A process as recited in claim 2 for further forming a diffused conducting line in said substrate surface in a second selected area isolated from said first selected area, further comprising the steps of:

simultaneously applying said layer of polysilicon over said second selected area, simultaneously providing a silicon nitride layer over said polysilicon layer over said second selected area, simultaneously delineating said silicon nitride layer to define a diffused conducting line nitride button overlying said polysilicon layer in said second selected area at a desired position, simultaneously removing the portions of the polysilicon layer over said second selected area exposed by removal of said silicon nitride layer thereby to retain only that portion of said polysilicon layer over said second selected area underlying said diffused conducting line contact button thereby to expose the corresponding underlying portion of said substrate in said second selected area, simultaneously oxidizing said exposed surface portion of said substrate in said second selected area, and simultaneously removing said diffused conducting line nitride button to expose the underlying surface of said remaining polysilicon layer portion and afford thereby a self-aligned contact to said diffused conducting line.

4. A process for forming very large scale integrated circuits on a monocrystalline silicon semiconductor substrate having field oxide regions surrounding and isolating at least a first selected area in which a field effect semiconductor device is to be formed having source, gate, and drain regions and at least a second selected area in which a diffused conducting line is to be formed, and for providing self-aligned contacts to at least selected ones of said source, gate, and drain regions and said conducting line, wherein said semiconductor device has a gate electrode formed on a gate dielectric layer formed in turn on said substrate surface and defining said gate region, comprising the steps of:

forming an oxide layer on said substrate extending centrally across said selected area including said gate region thereof and separating first and second remaining portions of said selected area corresponding to said source and drain regions thereof, respectively, applying a layer of polysilicon over said first selected area including said central oxide layer and said second selected area, providing a silicon nitride layer over said polysilicon layer, delineating said silicon nitride layer by removal of selected portions thereof to define a gate nitride button extending across said selected area in alignment with said central oxide layer but of lesser width, corresponding to the desired width of a gate dielectric layer of said device, and first and second nitride buttons being spaced from said gate nitride button and extending across said selected area in alignment with said first and second portions thereof, respectively, and to define a diffused conducting line button overlying said layer of polysilicon on said second selected area at a desired contact position thereof, removing the portions of the polysilicon layer exposed between said spaced-apart buttons and removing any portion of said central oxide layer exposed by removal of said portions of said polysilicon layer thereby to define said gate dielectric layer and to expose the respectively underlying portions of said silicon substrate and removing the portions of the polysilicon layer on said second selected area of said substrate except for the portion thereof underlying said diffused conducting line contact button to expose the underlying portion of said silicon substrate, doping said substrate surface at said exposed portions thereof to establish said source and drain regions, oxidizing said exposed surface portions of said substrate for electrically insulating said polysilicon layer portion underlying said gate nitride button from said polysilicion layer portions underlying said source and drain nitride buttons and for insulating the surface of said diffused conducting line, and removing said nitride buttons by a material selective removal process to expose the respectively underlying surfaces of said polysilicon layer portions and afford thereby self-aligned contacts to each of said source, gate, and drain regions of said field effect device and to said diffused conducting line.

5. A process as recited in claims 2, 3, or 1 wherein said doping step is performed by ion implant doping of said substrate survace at said exposed portions thereof.

6. A process as recited in claims 2, 3, or 1 wherein said oxidizing step is performed by thermal oxidation of said substrate and associated layers formed thereon.

7. A process as recited in claims 2, 3, or 1 wherein said oxidizing step is performed by thermal oxidation of said substrate for a sufficient time to form a thermal oxide contiguous with said polysilicon layer portion of said gate and said polysilicon layer portions of said source and drain and extending therebetween, up at least to the surface of said polysilicon layer portion underlying said gate nitride button.

8. A process as recited in claims 2, 3, or 1 further comprising applying conductors to said substrate surface contact said exposed contacts thereby to provide external electrical connection.

9. A semiconductor device formed by the processes of claims 2 or 1.

10. A very large scale integrated circuit formed by the process of claim 3.

\* \* \* \* \*